US009318365B2

(12) United States Patent
Yamaguchi

(10) Patent No.: US 9,318,365 B2
(45) Date of Patent: Apr. 19, 2016

(54) SUBSTRATE PROCESSING APPARATUS

(71) Applicant: DAINIPPON SCREEN MFG. CO., LTD., Kyoto (JP)

(72) Inventor: Takahiro Yamaguchi, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 127 days.

(21) Appl. No.: 14/150,910

(22) Filed: Jan. 9, 2014

(65) Prior Publication Data

US 2014/0261162 A1    Sep. 18, 2014

(30) Foreign Application Priority Data

Mar. 15, 2013    (JP) .................................. 2013-052977

(51) Int. Cl.
| | |
|---|---|
| *B05C 5/02* | (2006.01) |
| *H01L 21/687* | (2006.01) |
| *H01L 21/67* | (2006.01) |
| *G03F 7/30* | (2006.01) |
| *G03F 7/16* | (2006.01) |

(52) U.S. Cl.
CPC ............ *H01L 21/68728* (2013.01); *B05C 5/02* (2013.01); *H01L 21/6715* (2013.01); *H01L 21/67051* (2013.01); *G03F 7/162* (2013.01); *G03F 7/3021* (2013.01)

(58) Field of Classification Search
CPC .......... B05C 5/02; B05C 13/00; B05C 13/02; B05D 1/005; H01L 21/68728; H01L 21/67051; H01L 21/67178; H01L 21/6715; H01L 21/2885; C25D 21/00; C25D 17/001; C25D 7/123; G03F 7/162; G03F 7/3021

USPC ............. 118/52, 56, 319, 320, 500; 427/240; 134/902; 204/242

See application file for complete search history.

(56) References Cited

U.S. PATENT DOCUMENTS

| | | | | |
|---|---|---|---|---|
| 5,326,725 | A | * | 7/1994 | Sherstinsky et al. .......... 438/778 |
| 5,936,829 | A | * | 8/1999 | Moslehi ........................ 361/234 |
| 6,579,430 | B2 | * | 6/2003 | Davis et al. ............... 204/297.01 |
| 7,241,362 | B2 | * | 7/2007 | Shimbara et al. ......... 156/345.55 |
| 2002/0153676 | A1 | * | 10/2002 | Noguchi ........................ 279/106 |
| 2004/0226655 | A1 | | 11/2004 | Kajino et al. ............. 156/345.11 |
| 2007/0134431 | A1 | | 6/2007 | Hara et al. ..................... 427/437 |
| 2009/0056766 | A1 | * | 3/2009 | Nanba .............................. 134/33 |
| 2009/0084183 | A1 | * | 4/2009 | Baan et al. ....................... 73/618 |
| 2012/0061806 | A1 | | 3/2012 | Liu et al. ....................... 257/629 |

FOREIGN PATENT DOCUMENTS

TW    200729345    8/2007

\* cited by examiner

*Primary Examiner* — Laura Edwards
(74) *Attorney, Agent, or Firm* — Ostrolenk Faber LLP

(57) ABSTRACT

A substrate processing apparatus for processing a substrate comprises: a plurality of chuck pins each having an accommodating groove for accommodating a portion of peripheral part of the substrate, holding the substrate at a hold position in a horizontal posture by pressing inner faces of the accommodating grooves toward portions of peripheral part of the substrate; and a plurality of guide members, being disposed on or above the respective plurality of chuck pins, guiding process liquid discharged from the substrate to a surrounding area of the substrate; wherein each of the plurality of guide member includes: an inner-edge guide disposed at a position inward and above the accommodating groove; and an outer-edge guide disposed at a position level with or below the inner-edge guide and outward the chuck pin.

10 Claims, 7 Drawing Sheets

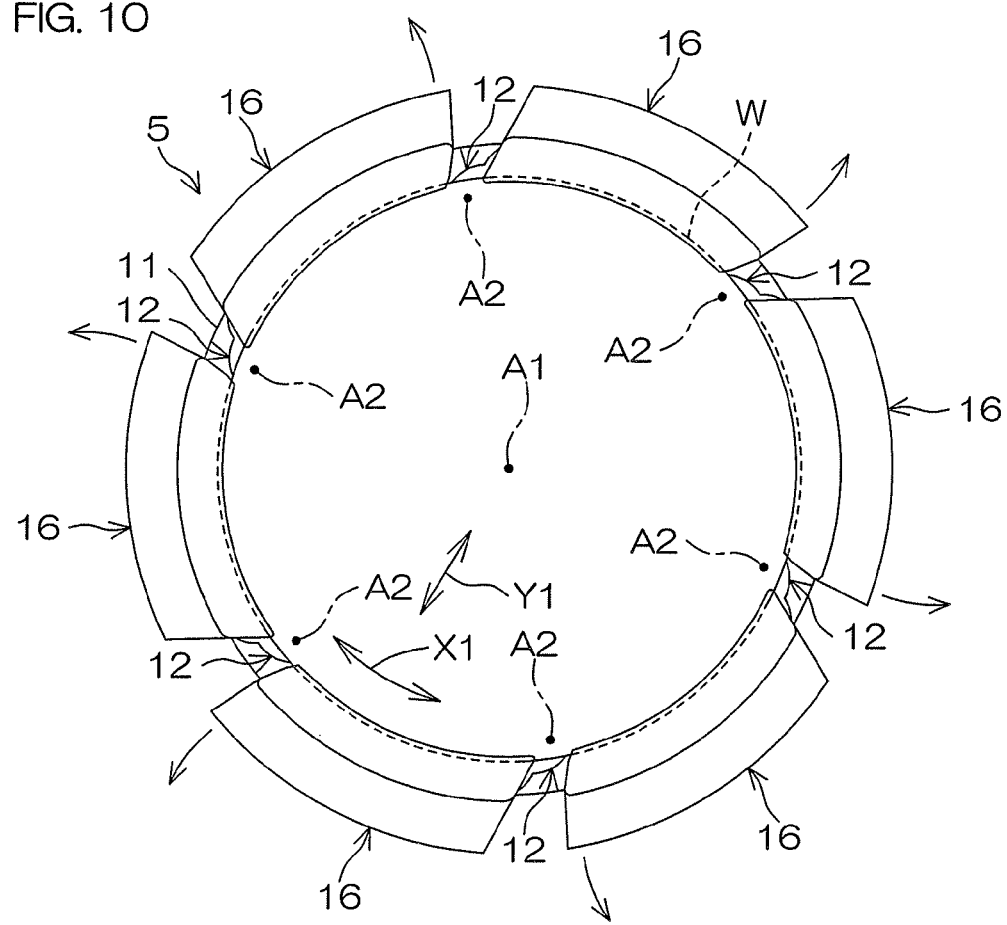

SUBSTRATE PROCESSING APPARATUS

BACKGROUND OF THE INVENTION

1. Field of the Invention

The present invention generally relates to a substrate processing apparatus for processing substrates with process liquids. Examples of substrates to be processed include semiconductor wafers, glass substrates for liquid crystal displays, glass substrates for plasma displays, substrates for FEDs (field emission displays), substrates for optical discs, substrates for magnet discs, substrates for magnet-optical discs, glass substrates for photomasks, substrates for ceramics, substrates for solar cells, etc.

2. Description of Related Art

In the manufacturing process of semiconductor or liquid crystal display apparatus, substrate processing apparatuses of single substrate processing type for processing substrates one-by-one basis or substrate processing apparatuses of batch type for processing substrates in a lump are used.

The substrate processing apparatus of single substrate processing type described in U.S. Patent Application Publication No. 2004/226655 A1 comprises a spin base for holding a substrate, a plurality of chuck pin disposed on the spin base, an electric motor for rotating the spin base, an atmosphere blocking plate disposed to oppose the spin base, a process liquid nozzle for ejecting process liquid from the center part of the lower face of the atmosphere blocking plate toward the center part of the substrate and a cup encircling the substrate hold by the spin base.

In the above-mentioned conventional substrate processing apparatus, the electric motor rotates the spin base in a condition that the plurality of chuck pin hold the substrate in a horizontal posture. Further, process liquid ejected from the process liquid nozzle is supplied, passing through the center part of the lower face of the atmosphere blocking plate, to the upper face of the substrate in a rotating condition in a condition that the lower face of the atmosphere blocking plate is close to the upper face of the substrate. Receiving centrifugal forces due to rotation of the substrate, process liquid supplied to the upper face of the substrate extends outwardly over the substrate. On reaching a peripheral part of the upper face of the substrate, process liquid is thrown off toward surrounding area of the substrate to be received by the cup.

Process liquid supplied onto the substrate in a rotating condition extends outwardly along over the substrate, moving to peripheral part of the substrate. A plurality of chuck pins are disposed at intervals in a circumferential direction. Most part of process liquid is discharged in a generally horizontal direction from the peripheral part of the substrate, excepting positions on which the chuck pins are placed. In contrast, at the positions where the chuck pins are disposed, process liquid may turn into liquid droplets or mist on reaching the neighborhood of the chuck pins to collide with upper part of the chuck pins. Therefore process liquid supposed to be discharged toward surrounding area of the substrate could reattach onto the substrate in the form of liquid droplets or mist. Also, process liquid reaching at the neighborhood of the chuck pins may flow over the upper part of the chuck pins to be splashed in directions outward and obliquely upward.

Splashes of process liquid splashed over toward surrounding area of the substrate collide with the inner face of the cup to be bounced back to the substrate side. Driven by down flow (downward atmospheric flow), droplets or mist of process liquid generated by collision between the cup and process liquid make move downward while moving inward. Therefore in case when directions of splashes of process liquid from peripheral part of the substrate are generally horizontal, droplets or mist of process liquid move to positions below the substrate. In contrast, in case when directions of splashes of process liquid from peripheral part of the substrate are obliquely upward, droplets or mist of process liquid move in directions inward and obliquely downward toward the upper face of the substrate, thus may resulting in reattachments of process liquid onto the substrate. For this reason, it is required to provide measures to avoid reattachments, such as making the cup larger in a radial direction in order to enlarge the distance between the substrate and the cup in a radial direction.

In the case of a conventional substrate processing apparatus described in U.S. Patent Application Publication No. 2004/226655 A1, because process liquid is supplied onto a substrate in a condition that lower face of the atmosphere blocking plate is close to the upper face of the substrate, possibility of reattachment of process liquid is low even when process liquid splashes in directions outward and obliquely upward from peripheral part of the substrate. However, in the case of this substrate processing apparatus, because the whole area of the upper face of the substrate is covered by the atmosphere blocking plate, it is not possible to move supply target positions of process liquid toward the upper face of the substrate between the central and peripheral part of the substrate. Also, because of the space required to make in order to move the atmosphere blocking plate up and down above the substrate, compared to configurations without such atmosphere blocking plate, height of the substrate processing apparatuses become larger.

SUMMARY OF THE INVENTION

A preferred embodiment of the present invention provides, a substrate processing apparatus for processing a substrate comprising: a plurality of chuck pins each having an accommodating groove for accommodating a portion of peripheral part of the substrate, holding the substrate at a hold position in a horizontal posture by pressing inner faces of the accommodating grooves toward portions of peripheral part of the substrate; a nozzle for ejecting process liquid toward the substrate held by the plurality of chuck pins; a plurality of guide members, being disposed on or above the respective plurality of chuck pins, guiding process liquid discharged from the substrate to a surrounding area of the substrate; a spin motor for rotating the plurality of chuck pins along with the plurality of guide members around a substrate rotation axis that vertically passes through the substrate; and a tubular cup, encircling the plurality of chuck pins and the guide members around the substrate rotation axis, receiving process liquid discharged outwardly from the substrate held by the plurality of chuck pins; wherein each of the plurality of guide member includes: an inner-edge guide disposed at a position inward and above the accommodating groove; and an outer-edge guide disposed at a position level with or below the inner-edge guide and outward the chuck pin. "Peripheral part" means circular part of substrate, which circular part lies outward from level parts of surface and back-surface of substrate. Accordingly, the peripheral part of the substrate includes: an inclined part that lies on peripheral part of the surface of the substrate, an inclined part that lies on peripheral part of the back-surface of the substrate and a circumferential end face.

According to this configuration, the peripheral part is accommodated in the accommodating grooves of the chuck pins. Then inner faces of the accommodating grooves are pressed onto the peripheral part of the substrate. Thereby the substrate is held in a horizontal posture at a hold position. A plurality of guide members are disposed above the plurality of chuck pins. A spin motor rotates the plurality of chuck pins along with the plurality of guide members around a substrate rotation axis. Process liquid ejected from the nozzle is supplied onto the substrate in a rotating condition held by the plurality of chuck pins. Thereby process liquid supplied onto the substrate extends outwardly along over the substrate, thrown off outward from the peripheral part of the substrate. A cup encircles the plurality of chuck pins and the guide members around the substrate rotation axis. Therefore, process liquid discharged off from the substrate is received by the cup.

Each inner-edge guide of the guide members is disposed at a position inward and upward from the corresponding accommodating groove. As is aforementioned, the peripheral part of the substrate is accommodated in the accommodating grooves. Therefore, the inner-edge guide is disposed at a position upward from the upper face of the substrate and inward from the circumferential end of the substrate. Therefore, the substrate, the chuck pin and the guide member define a collection groove having longitudinal section (severed with vertical plane) that faces inwardly. Receiving centrifugal forces, process liquid supplied onto the substrate in a rotational condition extends outwardly. On reaching the neighborhood of the chuck pin, process liquid enters into the collection groove.

Because process liquid reached in the neighborhood of the chuck pin enters into the collection groove defined by the substrate, the chuck pin and the guide member, diffusion of liquid droplets or mist is suppressed by the inner face of the collection groove, even when droplets or mist are generated by collision between process liquid and the chuck pins. Thereby, reattachments of process liquid onto the substrate are decreased. Moreover, as process liquid about to flow over the chuck pin is collected by the collection groove, the amount of process liquid dispersed obliquely upward from peripheral part of the substrate can be decreased. Therefore, it is possible to decrease the reattachments of droplets or mist generated by collisions between the cup and process liquid.

Also, process liquid entered into the collection groove is guided into the outer-edge guide along the lower face of the guide member. Because each of the outer-edge guides is disposed level with or below from the inner-edge guide, process liquid that flows outwardly is guided to horizontal or obliquely downward directions by the guide member. Further, as the outer-edge guide is disposed outward of the chuck pin, process liquid is, with the guide member, assuredly guided to a position outward of the chuck pin. Thus it is possible to suppress splashes of process liquid from the chuck pin in directions outward and obliquely upward, thereby decreasing reattachments of process liquid which could cause contamination or quality deterioration.

In the preferred embodiment of the present invention, the outer-edge guide may be disposed below from the accommodating groove.

According to this configuration, because the outer-edge guides are disposed below from the respective accommodating grooves of the chuck pins that accommodate peripheral part of the substrate, the substrate is disposed above from the outer-edge guide. In other words, the outer-edge guides are disposed below the substrate held at a hold position. Accordingly, process liquid is guided to positions below the substrate by the guide member, then is splashed outwardly toward the cup, from positions below the substrate. Therefore, it is possible to decrease the amount of droplets and mist generated above from the substrate, thereby further decreasing reattachments of process liquid.

In the preferred embodiment of the present invention, the guide member may further include a lower inclined face that is inclined so that the upper end of the lower inclined face is more inwardly positioned than the lower end of the lower inclined face. At least a part of the lower inclined face may be disposed between the chuck pin and the outer-edge guide in a radial direction perpendicular to the substrate rotation axis. The lower inclined face may be a plane that is inclined relative to a horizontal plane or may be a curved surface that bulges in a direction outward and obliquely upward.

According to this configuration, the lower inclined face, which is inclined so that the upper end of which is more inwardly positioned than the lower end of which, is provided in the guide member. As the lower inclined face is inclined relative to a horizontal plane, process liquid is guided to directions outward and obliquely below by the lower inclined face. Moreover, because at least a part of the lower inclined face is disposed between the chuck pin and the outer-edge guide in a radial direction, process liquid is guided to positions outward of the chuck pin and guided obliquely downward thereat. Therefore, it is possible to decrease the amount of process liquid splashes obliquely upward from peripheral part of the substrate, thereby further decreasing reattachments of process liquid.

In the preferred embodiment of the present invention, the guide member may further include an inward face that extends in a direction outward and obliquely downward from the inner-edge guide and that is disposed on or above the accommodating groove.

According to this configuration, an inward face, that is inclined relative to a horizontal plane so as to oppose a substrate rotation axis in a radial direction, is provided in the guide member. The inward face extends in a direction outward and obliquely downward, and is disposed on or above the accommodating groove. Thus process liquid reached in the neighborhood of the chuck pin enters into the collection groove defined by the substrate, chuck pin, and guide member, and is guided to directions outward and obliquely downward by the inward face. Thus it is possible to decrease the amount of process liquid splashing outward and obliquely upward, thereby further decreasing reattachments of process liquid.

In the preferred embodiment of the present invention, the guide member may further include an outward face that extends in a direction inward and obliquely upward from the outer-edge guide.

According to this configuration, an outward face, that is inclined so that the upper end of which is more inwardly positioned than the lower end of which, is provided in the guide member. The outward face extends in a direction inward and obliquely upward from the outer-edge guide. In a case that the outward face is inclined so that the upper end is more outwardly positioned than the lower end, process liquid is guided to directions outward and obliquely upward by the outward face. Accordingly, the amount of process liquid dispersed in directions outward and obliquely upward is increased. Thus it is possible to further decrease the amount of process liquid dispersed in directions outward and obliquely upward by inclining the outward face so that the upper end is more inwardly positioned than the lower end, thereby further decreasing reattachments of process liquid.

In the preferred embodiment of the present invention, the chuck pin may include a pin top face disposed on or above the accommodating groove. The guide member may be distinct from the chuck pin. In this case, the guide member may be disposed on the pin top face.

According to this configuration, because the chuck pin is distinct from the guide member, it is possible to achieve less intricate shape of the chuck pin. Likewise, it is possible to achieve less intricate shape of the guide member. Moreover, as the guide member is disposed on the pin top face, the guide member can assuredly guide process liquid, that is about to flow over the pin top face, to directions horizontal and obliquely downward. Accordingly, it is possible to further decrease the amount of process liquid splashing in directions outward and obliquely upward, thereby further decreasing reattachments of process liquid.

In the preferred embodiment of the present invention, the guide member may overlap the whole area of the pin top face in a planar view.

According to this configuration, the guide member is disposed on or above the pin top face, the guide member overlaps the pin top face in planar view. The area of the guide member in planar view is larger than that of the pin top face in planar view. The guide member covers the whole area of the pin top face from thereabove. Accordingly, it is possible to decrease the amount of process liquid splashing in directions outward and obliquely upward more than a case that the guide member partially covers the pin top face. Thereby it is possible to further decrease reattachments of process liquid.

In the preferred embodiment of the present invention, height difference of the inner-edge guide from the pin top face may be greater than that of the pin top face from the upper face of the substrate at the hold position.

According to this configuration, height difference of the inner-edge guide from the pin top face is greater than that of the pin top face from the upper face of the substrate at the hold position. In other words, vertical distance of the pin top face from the upper face of the substrate is small. Accordingly, shortening of vertical distance from the upper face of the substrate to the inner-edge guide is achieved, making the inner-edge guide more proximate to the upper face of the substrate. Thus, shortening of the vertical length of the collection groove defined by the substrate, the chuck pin and the guide member is achieved, decreasing the volume of the collection groove. Thereby the gap in a vertical direction between the substrate and the guide member becomes easier to be filled with process liquid. When the collection groove is filled with process liquid, subsequent process liquid does not directly collide with the inner face of the collection groove. Therefore it is possible to decrease the amount of droplets or mist of process liquid generated by collision, thereby decreasing reattachments of process liquid.

In the preferred embodiment of the present invention, distance from the inner-edge guide to an inner edge of the pin top face in a radial direction that is perpendicular to the substrate rotation axis, may be greater than height difference of the pin top face from an upper face of the substrate at the hold position.

According to this configuration, distance from the inner-edge guide to an inner edge of the pin top face in a radial direction that is perpendicular to the substrate rotation axis is greater than height difference of the pin top face from an upper face of the substrate at the hold position. In other words, the amount of inward protrusion of the guide member from the inner edge of the pin top face is large, and distance in a radial direction from the inner-edge guide to the circumferential end of the substrate is long. Accordingly, depth of the collection groove 58 (horizontal length between the opening part of the collection groove and the bottom of the collection groove) is sufficiently secured. Thus, the guide member can assuredly intercept process liquid about to flow over the chuck pin, guiding process liquid to directions horizontal or obliquely downward. Thereby it is possible to decrease reattachments of process liquid.

In the preferred embodiment of the present invention, the plurality of guide members may be circularly disposed along a circumferential direction around the substrate rotation axis. In this case, length of the guide member in a circumferential direction may be greater than distance between the two adjacent members in the circumferential direction.

According to this configuration, the guide member has a length in a circumferential direction greater than a distance between the two adjacent members in the circumferential direction. Therefore, the area wherein the splashing directions of process liquid are controlled by the guide member is long in the circumferential direction. Thus, it is possible to further decrease the amount of process liquid that splashes in directions outward and obliquely upward by the plurality of guide members, thereby decreasing reattachments of process liquid. Moreover, because process liquid on the substrate is held inward of the plurality of guide members by means of the plurality of guide members each having long length in a circumferential direction, it is possible to decrease the requisite amount of process liquid to form liquid film covering the whole area of the upper face of the substrate. Thereby it is possible to decrease running cost of the substrate processing apparatus.

The aforementioned or other objects, features and effects of the present invention shall be clarified by the following description of the preferred embodiments with references to the accompanying drawings.

BRIEF DESCRIPTION OF THE DRAWINGS

FIG. 10 is a vertical cross-sectional schematic view of a guide member according still another preferred embodiment of the present invention.

DETAILED DESCRIPTION OF PREFERRED EMBODIMENTS

Figure 1:
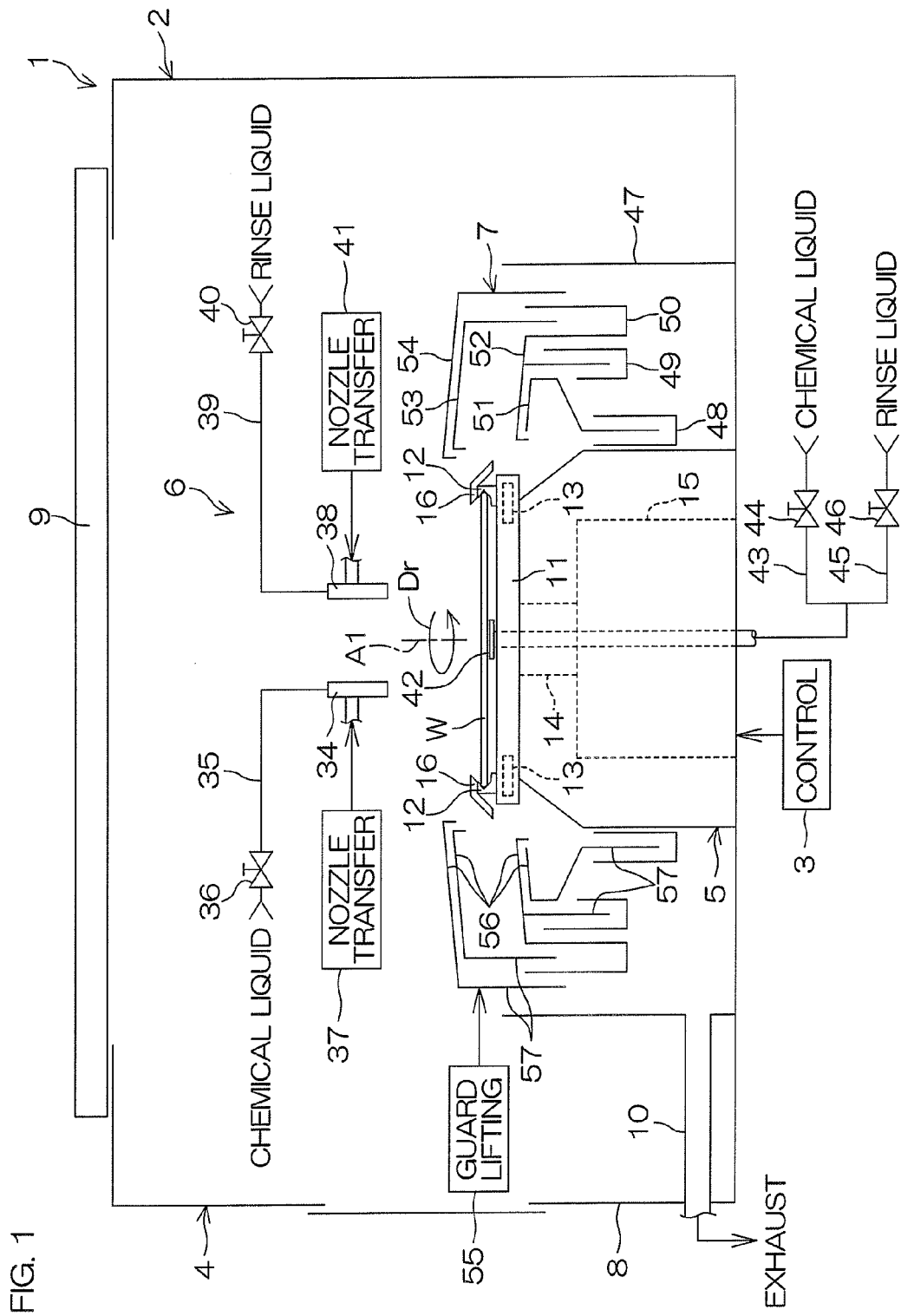
FIG. 1 is a schematic view showing the inside configuration of a chamber comprised in a substrate processing apparatus according to a preferred embodiment.
Figure 2:
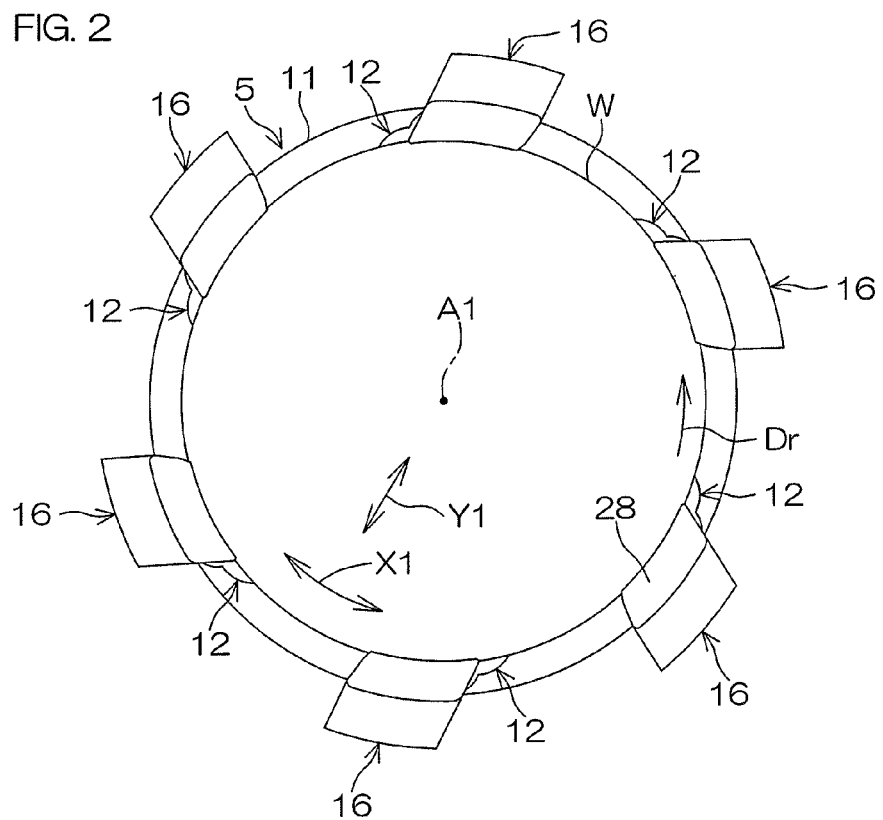
FIG. 2 is a schematic plan view of a spin chuck.
Figure 3:
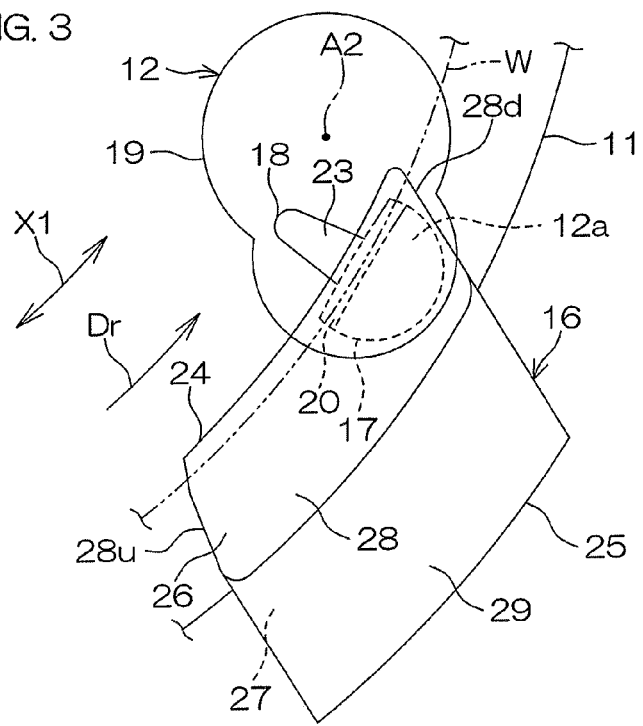
FIG. 3 is a schematic plan view of the chuck pin and a guide member.
Figure 4A:
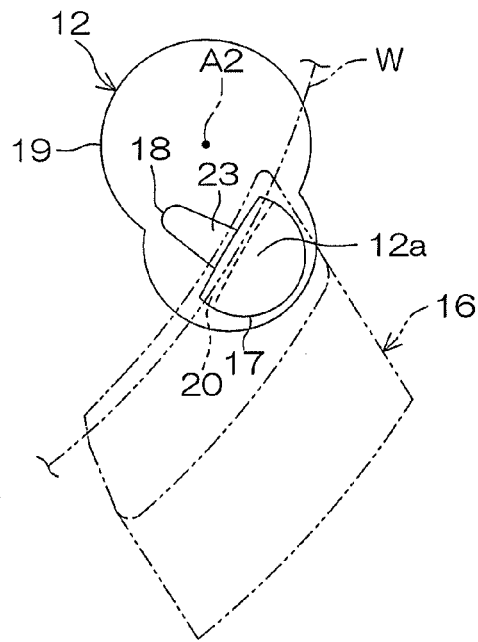
FIG. 4A is a schematic plan view showing the chuck pin is positioned at a close position.
Figure 4B:
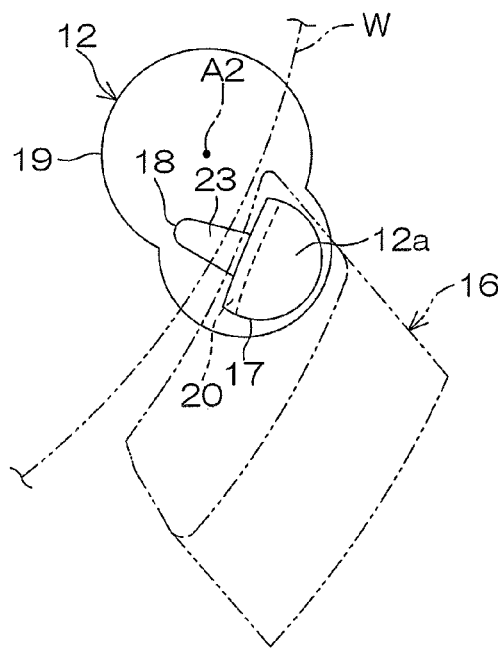
FIG. 4B is a schematic plan view showing the chuck pin is positioned at an open position.
Figure 5:
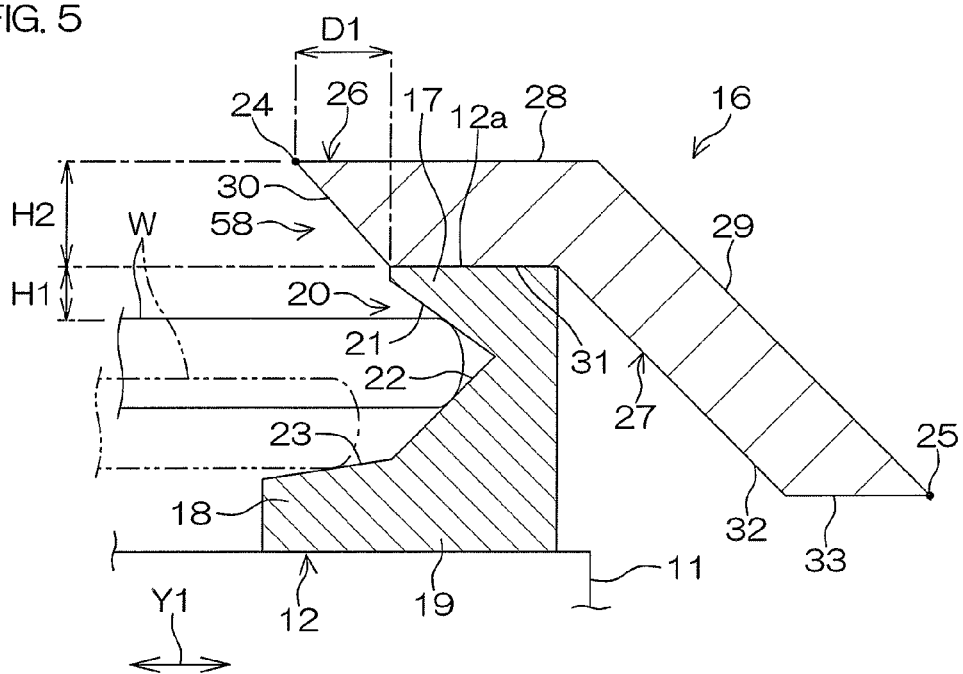
FIG. 5 is a vertical cross-sectional schematic view of the chuck pin and the guide member.

FIG. 1 is a schematic view showing the inside configuration of a chamber comprised in a substrate processing apparatus according to a preferred embodiment. FIG. 2 is a schematic plan view of a spin chuck. FIG. 3 is a schematic plan view of the chuck pin and a guide member. FIGS. 4A and 4B are, respectively, a schematic plan view showing the chuck pin is positioned at a close position, and a schematic plan view showing the chuck pin is positioned at an open position. FIG. 5 is a vertical cross-sectional schematic view of the chuck pin and the guide member. As shown in FIGS. 4A and 4B, the chuck pin 12 can move between a close position (shown in FIG. 4A) and an open position (shown in FIG. 4B). Hereinafter, unless otherwise specified, illustration will be made in a condition that the chuck pin 12 is positioned at the close position.

As is shown in FIG. 1, a substrate processing apparatus 1 is an apparatus of single substrate processing type that processes circular substrates W such as semiconductor wafer on a one-by-one basis. The substrate processing apparatus 1 comprises a process unit 2 for supplying process liquid onto substrates W and a control device 3 that controls performances of devices provided in the substrate processing apparatus or controls open/close of valves.

As shown in FIG. 1, each of the process units 2 is a unit of single substrate processing type that processes substrate W on one-by-one basis. Each of the processing units 2 comprises: a box-shaped chamber 4 having an interior space; a spin chuck 5 that holds one substrate W in a horizontal posture in the chamber 4 and rotates the substrate W about a vertical substrate rotation axis A1 passing through the center of the substrate W; a process liquid supply device 6 for supplying process liquid onto the substrate W held by the spin chuck 5; and a tubular cup surrounding the spin chuck 5 around the substrate rotation axis A1.

As shown in FIG. 1, the chamber 4 includes: a box-shaped dividing wall 8 that accommodates the spin chuck 5 or the like; FFU 9 (Fan Filter Unit 9) as a venting unit for blowing clean air (air filtered by filters) from upper part of the dividing wall 8 into inner side of the dividing wall 8; and an exhaust duct 10 for discharging air in the chamber 4 via lower part of the cup 7. The FFU 9 is disposed above the dividing wall 8. FFU 9 blows clean air in a downward direction from a ceiling of the dividing wall to the interior of the chamber 4. The exhaust duct 10 is connected to the bottom of the cup 7 and guides air in the chamber 4 towards an exhaust facility provided in the factory wherein the substrate processing apparatus is installed. Therefore, down flow (downward flow) that flows downward in the chamber 4 is formed by the FFU 9 and the exhaust duct 10. Processing of the substrate W is performed in a condition wherein down flow is formed within the chamber 4.

As is shown in FIG. 1, the spin chuck 5 includes: a disk-shaped spin base 11 held in a horizontal posture; a plurality of chuck pins 12 extruding upwardly from the outer peripheral part of the upper face of the spin base 11; and a chuck open-close mechanism 13. The spin chuck 5 further includes: a spin shaft 14 extending downwardly from the center part of the spin base 11; a spin motor 15 that rotates the spin base 11 and the chuck pins 12 about the substrate rotation axis A1 by rotating the spin shaft 14; and a plurality of guide members 16 that guide process liquid discharged from the substrate W by centrifugal forces towards the surrounding area of the substrate W.

As is shown in FIG. 1, outer diameter of the spin base 11 is larger than that of the substrate W. The centerline of the spin base 11 is disposed on the substrate rotation axis A1. The plurality of chuck pins 12 are held by the spin base 11 at outer circumferential part of the spin base 11. The plurality of chuck pins 12 are disposed at intervals in a circumferential direction X1 around the substrate rotation axis A1. Each of the chuck pins 12 is pressed toward peripheral part of the substrate W. Thereby the substrate W is held horizontally in a condition that the lower face of the substrate W and the upper face of the spin base 11 are separated in a vertical direction. Thereafter when the spin motor 15 rotates the spin shaft 14 in a condition that the substrate W is sandwiched by the plurality of chuck pins 12, the substrate W rotates about the substrate rotation axis A1 along with the spin base 11 and the chuck pins 12.

As is shown in FIG. 5, the chuck pin 12 includes: a holding part 17 pressed toward the circumferential end of the substrate W; and a support part 18 for supporting the lower face of the peripheral part of the substrate W. As is shown in FIG. 3, the chuck pin 12 further includes a base part 19 that rotates about a pin rotation axis A2 that is parallel with the substrate rotation axis A1, along with the holding part 17 and the support part 18.

As is shown in FIG. 5, the holding part 17, the support part 18 and the base part 19 are integrally formed. The holding part 17 and the support part 18 are supported by the base part 19. The base part 19 is driven by the chuck open-close mechanism 13 around the pin rotation axis A2. The holding part 17 and the support part 18 are disposed on or above the spin base 11. The holding part 17 and the support part 18 are disposed at a position inward (on the side of the substrate rotation axis A1. Left side in FIG. 5) from the outer circumferential face of the spin base 11. The holding part 17 is disposed above the support part 18. As is shown in FIG. 3, the holding part 1 and the support part 18 are disposed at the surrounding area of the pin rotation axis A2 and do not intersect with the pin rotation axis A2.

As is shown in FIG. 5, the holding part 17 includes: two groove inner faces 21, 22 defining the accommodating groove 20 having a longitudinal cross-section (severed with vertical plane) in the shape of V, which faces inward. The two groove inner faces 21, 22 comprises an upper groove inner face 21 that extends in a direction inward and obliquely upward from the bottom of the accommodating groove 20 and a lower groove inner face 22 that extends in a direction inward and obliquely downward from the bottom of the accommodating groove 20. The support part 18 includes a support face 23 that extends in a direction obliquely downward from the lower ends of the two groove inner faces 21, 22 (inner end of the lower groove inner face) to the side of the substrate rotation axis A1.

As is shown in FIG. 5, the support face 23 is disposed below the accommodating groove 20. The support face 23 is disposed inward of the lower groove inner face 22, and is continuous with the lower groove inner face 22. The upper groove inner face 21 and the lower groove inner face 22 are of similar size and are inclined relative to a horizontal plane, each of them inclining in an opposite direction at an equal angle. Inclination angle of the support face 23 from a horizontal plane is smaller than that of the lower groove inner face 22 relative to the horizontal plane. As is shown in FIG. 3, the length of the support face 23 in a circumferential direction is shorter than the length of the pin top face 12a which corresponds to an upper face of the holding part 17. The accommodating groove 20 extends along the circumferential end face of the substrate W.

As is shown in FIGS. 4A and 4B, each of the chuck pins 12 is rotatable about the pin rotation axis A2 between a close position wherein the holding part 17 is pressed onto the circumferential end face of the substrate W and an open position wherein the holding part 17 is separated from the circumferential end face of the substrate W. The chuck open-close mechanism 13 rotates chuck pins 12 about respective pin rotation axes A2. The close position is a position wherein the substrate W is held by the plurality of chuck pins 12. The open position is a position wherein the substrate W is released from the hold thereof. The control device 3 switches the condition of the plurality of chuck pins 12 between a close condition wherein the plurality of chuck pins 12 hold the substrate W and an open condition wherein the hold of the substrate W is released, by controlling the chuck open-close mechanism 13.

When a substrate W is transferred to the spin chuck 5, the control device 3 retreats each of the chuck pins 12 into the open position. Maintaining the condition, the control device 3 causes a transfer robot to mount the substrate W onto the plurality of chuck pins 12. With this, as shown in FIG. 5 in alternate long and two short dashes lines, respective support faces 23 of the support parts 18 contact with a peripheral part of the lower face of the substrate W to support the substrate W at a support position above of the upper face of the spin base 11 in a horizontal posture. The control device 3 moves each of the chuck pins 12 from the open position to the close position. Because the support face 23 extends in a direction obliquely upward toward the accommodating groove 20, the substrate W is gradually lifted with the plurality of support faces 23 as each of the chuck pins 12 makes move toward its close position. Also, as each of the chuck pins 12 makes move toward its close position, the holding part 17 approaches the circumferential end of the substrate W, and the peripheral part of the substrate W enters into the accommodating groove 20. Accordingly, as is shown in FIG. 5 in solid lines, the upper side groove inner face 21 and the lower side groove inner face 22 are pressed onto the peripheral part of the substrate W to hold the substrate W at a hold position above the support position in a horizontal posture.

As is shown in FIG. 5, the plurality of guide members 16 are positioned on or above the respective plurality of chuck pins 12. FIG. 5 illustrates an example wherein a guide member 16 is composed of a plate having even thickness. The chuck pin 12 and the guide member 16 are distinct member and are joined together. The guide member 16 covers the corresponding chuck pin 12 from above the chuck pin 12. The guide member 16 is disposed on the holding part 17. The guide member 16 extrudes inward and outward (A direction away from the substrate rotation axis A1. Right side in FIG. 5) from the pin top face 12a. The guide member 16 is disposed above or around the substrate W positioned at the hold position.

As is shown in FIG. 2, the plurality of guide members 16 are disposed at intervals in a circumferential direction X1. The length of the guide member 16 in the circumferential direction X1 (specifically, the length of the upper horizontal face 28 (described later) in the circumferential direction X1) is shorter than an interval between two adjacent guide members in the circumferential direction X1. As is shown in FIG. 3, the area of the guide member 16 in planar view is larger than that of the pin top face 12a in planar view. The guide member 16 overlaps the whole area of the pin top face 12a in planar view. Accordingly, the whole area of the pin top face 12a is covered with the guide member 16. The guide member 16 extends from the pin top face 12a toward upstream side in a rotation direction Dr of the substrate W. Further, guide member 16 is disposed on the upstream side in the rotation direction Dr of the substrate W, from the pin rotation axis A2. The guide member 16 is disposed outward from the pin rotation axis A2.

The plurality of guide members 16 are fixed to the respective plurality of chuck pins 12. Accordingly, each of the guide members 16, along with the corresponding chuck pin 12, rotates about the pin rotation axis A2, while rotating around the substrate rotation axis A1 along with the spin base 11 and the chuck pin 12. As is shown in FIGS. 4A and 4B, in a condition wherein the chuck pin 12 is positioned at the open position, the guide member 16 does not overlap the substrate W in planar view. As the chuck pin 12 moves to the close position side, the guide member 16 moves inwardly toward the substrate W.

As is shown in FIG. 5, the guide member 16 includes: an inner-edge guide 24 disposed inward and above from the accommodating groove 20; an outer-edge guide 25 disposed below the inner-edge guide 24 and outward the chuck pin 12; an upper guide face 26 extending along the upper side part of the guide member 16 from the inner-edge guide 24 to the outer-edge guide 25; and a lower guide face 27 extending along the lower side part of the guide member 16 from the inner-edge guide 24 to the outer-edge guide 25.

As is shown in FIG. 3, the inner-edge guide 24 extends in a circumferential direction X1. Likewise, the outer-edge guide 25 extends in the circumferential direction X1. The inner-edge guide 24 may be a horizontally extending curved line as shown in FIG. 5; or may be a curved face, cross-sections of which being vertical lines. The shape of the outer-edge guide goes likewise. The inner-edge guide 24 is disposed inward from the outer-edge guide 25. The inner-edge guide 24 is disposed inward from the pin top face 12a and the outer-edge guide 25 is disposed outward from the pin top face 12a. As is shown in FIG. 3, each length of the inner-edge guide and the outer-edge guide 25 in the respective circumferential direction X1 is longer than the length of the pin top face 12a in a circumferential direction X1. The inner-edge guide 24 is disposed inward from the circumferential end face of the substrate W positioned at the hold position, and overlaps the substrate W in planar view. In contrast, the outer-edge guide 25 is disposed outward from the circumferential end face of the substrate W positioned at the hold position, and does not overlap the substrate W in planar view.

As is shown in FIG. 5, the inner-edge guide 24 is disposed inward from the two groove inner faces 21, 22. The inner-edge guide 24 is disposed above from the upper face of the substrate W positioned at the hold position. Height difference H1 from the upper face of the substrate W positioned at the hold position to the pin top face 12a is smaller than height difference from the pin top face 12a to the inner-edge guide 24. Accordingly, height difference from the upper face of the substrate W to the guide member 16 is small, and the guide member 16 is in proximity to the upper face of the substrate W. Also, the height difference H1 is smaller than distance D1 from the inner-edge guide 24 to the inner edge of the pin top face 12a in a radial direction Y1 (A direction perpendicular to the substrate rotation axis A1). The outer-edge guide 25 is disposed below from the accommodating groove 20. The outer-edge guide 25 is disposed below from the lower face of the substrate W positioned at the hold position. The outer-edge guide 25 is disposed outward from the outer peripheral face of the spin base 11.

As is shown in FIG. 5, the upper guide face 26 is disposed above the lower guide face 27. The upper guide face 26 is a face of the guide member 16 facing upward, which can be seen from above the guide member 16. The lower guide face 27 is a face facing downward, which can not be seen from above the guide member 16. Each of the upper guide face 26 and the lower guide face 27 is composed of one or more planes.

As is shown in FIG. 5, the upper guide face 26 includes: an upper horizontal face 28 horizontally extending outward from the inner-edge guide 24; and an outward face 29 as an upper incline face, extending outward and obliquely downward from the upper horizontal face 28.

As is shown in FIG. 3, the upper horizontal face 28 of the upper guide face 26 includes: an inner edge and outer edge extending in a circumferential direction X1; and two side edges 28u, 28d, extending from either one of the inner edge and outer edge to another. The control device 3 rotates the substrate W in a given rotation direction Dr by controlling the spin motor 15. The side edge 28d on downstream side in the rotation direction Dr of the substrate W is inclined from the radial direction Y1 in planar view so that the inner end of the side edge is positioned on downstream side in the rotation direction Dr from the outer end of the side edge 28d.

As is shown in FIG. 5, the lower guide face 27 includes: an inward face 30 extending outward and obliquely downward from the inner-edge guide 24; a lower horizontal face 31 horizontally extending outward from the outer edge of the inward face 30 corresponding to the lower edge; a lower inclined face 32 extending outward and obliquely downward form the outer edge of the lower horizontal face 31; and a downward face 33 horizontally extending outward from the outer edge of the lower inclined face 32 corresponding to the lower edge.

As is shown in FIG. 5, the inward face 30 of the lower guide face 27 is disposed inward from the pin top face 12a. The inward face 30 of the lower guide face 27 and the lower horizontal face 31 are disposed below the upper horizontal face 28 of the upper guide face 26. The pin top face 12a is disposed below the upper horizontal face 28, the inward face 30 and the lower horizontal face 31. The lower inclined face 32 of the lower guide face 27 is disposed below the outward face 29 of the upper guide face 26. The outward face 29 and the lower inclined face 32 are parallel to each other and vertically overlap with each other.

As is shown in FIG. 1, the process liquid supply device 6 includes: a chemical liquid nozzle 34 as an upper face nozzle for ejecting chemical liquid toward the upper face of a substrate W; an upper chemical liquid pipe 35 connected to the chemical liquid nozzle 34; and an upper chemical liquid valve 36 interposed into the upper chemical liquid pipe 35. When the upper chemical liquid valve 36 is opened, chemical liquid supplied to the chemical liquid nozzle 34 from the upper chemical liquid pipe 35 is downwardly ejected from the chemical liquid nozzle 34. When the upper chemical liquid valve 36 is closed, ejection of chemical liquid form the chemical liquid nozzle 34 is halted. Examples of chemical liquid supplied to the chemical liquid nozzle 34 is a liquid comprising at least one of the following: sulfuric acid, acetic acid, nitric acid, hydrochloric acid, hydrofluoric acid, ammonia water, hydrogen peroxide water, organic acid (such as citric acid, dipotassium oxalate and the like), organic alkali (such as TMAH (Tetramethylammonium hydroxide and the like), surface activating agent, corrosion inhibitor.

The chemical liquid nozzle 34 is a scan nozzle for ejecting chemical liquid in such a manner that landing positions of chemical liquid toward the upper face of the substrate W move between the center part and the peripheral part thereof. As is shown in FIG. 1, the process unit 2 includes a chemical liquid nozzle transfer device 37 for moving landing positions of chemical liquid by moving the chemical liquid nozzle 34. The chemical liquid nozzle transfer device 37 moves landing positions within the boundary of the upper face of the substrate W by moving the chemical liquid nozzle 34. Moreover, the chemical liquid nozzle transfer device 37 moves the chemical liquid nozzle 34 among process positions on the upper face of the substrate W, onto which chemical liquid ejected from the chemical liquid nozzle 34 land, and a retreat position around the spin chuck 5, into which the chemical liquid nozzle 34 retreats.

As is shown in FIG. 1, the process liquid supply device 6 includes: a rinse liquid nozzle 38 as an upper face nozzle ejecting rinse liquid toward the upper face of the substrate W; an upper rinse liquid pipe 39 connected to the rinse liquid nozzle 38; and an upper rinse liquid valve 40 interposed into the upper rinse liquid pipe 39. When the upper rinse liquid valve 40 is opened, rinse liquid supplied from the upper rinse liquid pipe 39 to the rinse liquid nozzle 38 is ejected downward. When the upper rinse liquid valve 40 is closed, ejection of rinse liquid from the rinse liquid nozzle 38 is halted. Rinse liquid supplied to the rinse liquid nozzle 38 is pure water (Deionized water). Rinse liquid supplied to the rinse liquid nozzle 38 may not be limited to pure water, and may be one of carbonated water, electrolysis deionized water, hydrogen water, ozone water, IPA (isopropyl alcohol), hydrochloric acid water of dilute concentration (for example, 10 to 100 PPM or so).

The rinse liquid nozzle 38 is a scan nozzle. As is shown in FIG. 1, the process unit 2 includes a rinse liquid nozzle transfer device 41 for moving landing positions of rinse liquid within the upper face of the substrate W by moving the rinse liquid nozzle 38. The rinse liquid nozzle transfer device 41 moves landing positions of rinse liquid within the upper face of the substrate W by moving the rinse liquid nozzle 38. Moreover, the rinse liquid nozzle transfer device 41 moves the rinse liquid nozzle 38 between process positions on the upper face of the substrate W, onto which rinse liquid ejected from the rinse liquid nozzle 38 land; and a retreat position around the spin chuck 5, into which the chemical liquid nozzle 34 retreats.

As shown in FIG. 1, The process liquid supply device 6 includes: a lower-face nozzle 42 for ejecting process liquid toward the center part of the lower face of the substrate W; a lower chemical liquid pipe 43 connected to the lower-face nozzle 42; a lower chemical liquid valve interposed into the lower chemical liquid pipe 43; a lower rinse liquid pipe 45 connected to the lower-face nozzle 42; and a lower rinse liquid valve 46 interposed into the lower rinse liquid pipe 45. The lower-face nozzle 42 protrudes upward from the center of part of the upper face of the spin base 11. In a condition that the substrate W is held by the spin chuck 5 at the support position or hold position, the eject orifice of the lower-face nozzle 42 is positioned between the spin base 11 and the lower face of the substrate W that is above the spin base 11, and vertically opposes the center part of the lower face of the substrate W. Therefore, upon opening the lower chemical liquid valve 44 or the lower rinse liquid valve 46 in this condition, chemical liquid or rinse liquid ejected upward from the lower-face nozzle 42 is supplied to the center part of the lower face of the substrate W.

As is shown in FIG. 1, the cup 7 is disposed outward (in a direction away from the substrate rotation axis A1) from the substrate W held by the spin chuck 5. The cup 7 includes: an tubular outer wall 47 encircling the spin chuck 5; a plurality of process liquid cups (a first process liquid cup 48, a second process liquid cup 49 and a third process liquid cup 50); a plurality of guards for receiving process liquid splashed around the substrate W (a first guard 51, a second guard 52, a third guard 53 and a fourth guard 54); and a guard lifting device 55 for moving up and down each of the plurality of guards independently of each other.

As is shown in FIG. 1, each of the process liquid cups 48 to 50 encircles the spin chuck 5 at between the spin chuck 5 and the outer wall 47. The second process liquid cup 49 that is second layer counting from innermost is disposed at a more outward position than the first process liquid cup 48, while the third process liquid cup 50 is disposed at a more outward position than the second process liquid cup 49. The third process liquid cup 50 is integrally formed with the second guard 52, and moves up and down with the second guard 52. Each of the process liquid cups 48 to 50 defines a circular groove opening upward. Each of the guards 51 to 54 arbitrarily moves up and down in compliance with the types of process liquid to be supplied to a substrate W, and can guide used process liquid to arbitrary process liquid cup 48 to 50 in compliance with the types and the likes thereof. Process liquid guided by each of the process liquid cups 48 to 50 is sent to a recovery equipment (not shown) through the groove.

As is shown in FIG. 1, each of the guard 51 to 54 encircles the spin chuck 5 between the spin chuck 5 and the outer wall 47. Each of the three guards 51 to 53 of inner side is an inner guard encircled by at least one of the three outer side guards 52 to 54 and each of the three guards 52 to 54 of outer side is an outer guard encircling at least one of the three inner side guards 51 to 53.

As is shown in FIG. 1, each of the guards 51 to 54 includes a tubular inclined part 56 extending inward and obliquely upward and a tubular guard guide part 57 extending downward from the lower end of the inclined part 56. Each of the upper end part of the inclined parts 56 configures the upper end part of the respective guards 51 to 54, and has a larger diameter than that of the substrate W or the spin base 11. The four inclined part 56 are vertically piled up and the four guard guide parts 57 are coaxially disposed. Each of the three guard guide parts 57, except for the guard guide part 57 that is positioned at outer most layer, can enter within the plurality of process cups 48 to 50. Namely, the cup 7 is foldable and extending and folding of the cup 7 is conducted by the guard lifting device 55 moving up and down at least one of the four guards 51 to 54.

As is shown in FIG. 1, the guard lifting device 55 moves up and down each of the guards 51 to 54 between an upper position and a lower position, wherein each of upper ends of the guards is positioned above the substrate W at the upper position and each of the upper ends of the guards is positioned below the substrate W at the lower position. The guard lifting device 55 can keep each of the guards 51 to 54 at an arbitrary position between the upper position and lower position. Supplying of process liquid to the substrate W or drying of the substrate W is performed in a condition that one of the guards 51 to 54 opposes circumferential end face of the substrate W. For example, when opposing the third guard 53 that is third counting from the innermost toward the circumferential end face of the substrate W, the first guard 51 and the second guard 52 are positioned at the lower position, and the third guard 53 and the fourth guard 54 are positioned at the upper position. Also, upon opposing the outermost fourth guard 54 toward the circumferential end face of the substrate W, the fourth guard 54 is disposed upper position, and the other three guards 51 to 53 are positioned at the lower position.

Figure 6:
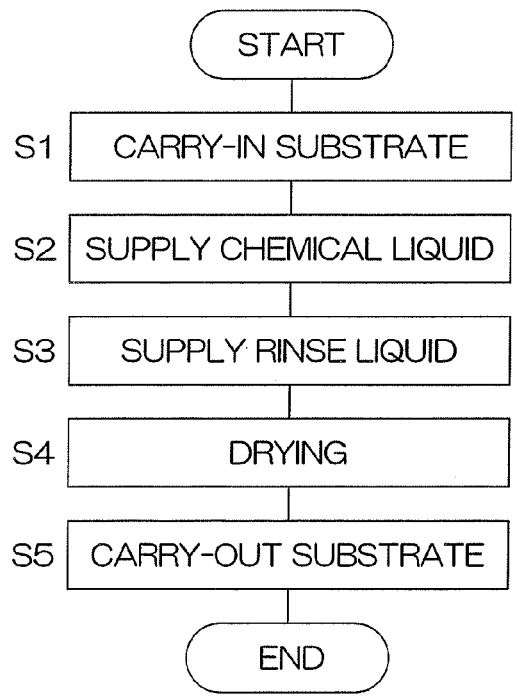
FIG. 6 is an operation flow chart showing an example of substrate processing performed by the substrate processing apparatus.

FIG. 6 is an operation flow chart showing an example of substrate processing performed by the substrate processing apparatus 1. Hereinafter FIG. 1 will be referenced. FIG. 6 will be referenced when appropriate.

When a substrate W is processed, a carry-in process (STEP S1 in FIG. 6) carrying in the substrate W into the chamber 4. Specifically, the control device 3 causes the transfer robot to carry the substrate W into the chamber 4 in a condition that all the nozzles are retreated from positions above the spin chuck 5 and all the guards are positioned at the lower position. And then the control device 3 causes the transfer robot to mount the substrate W onto the plurality of chuck pins 12. And then the control device 3 causes the transfer robot to retreat from within the chamber 4. Moreover, the control device 3 causes the plurality of chuck pins 12 to hold the substrate W, by controlling the chuck open-close mechanism 13. Thereafter, the control device 3 causes the spin base 11, chuck pins 12, and guide members 16 to rotate around the substrate rotation axis A1, by controlling the spin motor 15, thereby starting the rotation of the substrate W.

Next, a chemical liquid supply process (STEP S2 in FIG. 6) for supplying chemical liquid to the substrate W is performed. Specifically, the control device 3 makes the chemical liquid nozzle 34 move from a retreat position to a process position, by controlling the chemical liquid nozzle transfer device 37. Further, the control device 3 makes the two guards on the outer side (the third guard 53 and the fourth guard 54) be positioned at an upper position and makes the two guards on the inner side (the first guard 51 and the second guard 52) be positioned at the lower position. With this, the gap between the third guard 53 and the second guard 52 is widened, and the inner circumferential face of the third guard 53 opposes the circumferential end face of the substrate W.

In this condition, the control device 3 opens the upper chemical liquid valve 36 and the lower chemical liquid valve 44, allowing the chemical liquid nozzle 34 to eject chemical liquid toward the upper face of the substrate W in a rotating condition while allowing the lower-face nozzle 42 to eject chemical liquid toward the center part of the lower face of the substrate W in the rotating condition. The control device 3 further causes landing positions of chemical liquid against the upper face of the substrate W to move between the center part and the peripheral part of the substrate W, by controlling the chemical liquid nozzle transfer device 37. And after the elapse of a given time counting from the opening of the upper chemical liquid valve 36 and the lower chemical liquid valve 44, the control device 3 makes the ejection of chemical liquid from the chemical liquid nozzle 34 and the lower-face nozzle 42 be halted by closing the upper chemical liquid valve 36 and the lower chemical liquid valve 44. Thereafter, the control device 3 makes the chemical liquid nozzle 34 be retreated from above the spin chuck 5 by controlling the chemical liquid nozzle transfer device 37.

Chemical liquid ejected from the chemical liquid nozzle 34 lands on the upper face of the substrate W to flow along the upper face of the substrate W by centrifugal forces. Likewise, chemical liquid ejected from the lower-face nozzle 42 lands on the central part of the lower face of the substrate W, to flow outwardly along the lower face of the substrate W by centrifugal forces. With this, a liquid film covering the whole area of the upper face of the substrate W is formed, and chemical liquid is supplied to the whole area of the upper face of the substrate W. Therefore the whole area of the upper face of the substrate W is processed by chemical liquid. Likewise, chemical liquid ejected from the lower-face nozzle 42 is supplied to the whole area of the lower face of the substrate W, and the whole area of the lower face of the substrate W is processed by chemical liquid.

Further, because the control device 3 makes landing positions of chemical liquid move between the center part and the peripheral part of the substrate W in a condition that the substrate W rotates, landing positions of chemical liquid pass through the whole area of the upper face of the substrate W to scan through the whole area of the upper face of the substrate W. Because of this, chemical liquid ejected from the chemical liquid nozzle 34 is directly blown over the whole are of the upper face of the substrate W, to uniformly process the whole are of the upper face of the substrate W. Also, chemical liquid reaching the peripheral part of the upper and lower faces is thrown off toward surrounding area of the substrate W. Therefore, chemical liquid discharged from the substrate W is guided into the interior of the cup 7 through the gap between the third guard 53 and the second guard 52, to be collected into the first process liquid cup 48.

Next, a rinse liquid supply process (STEP S3 in FIG. 6) for supplying pure water as an example of rinse liquid is performed. Specifically, the control device 3 makes the rinse liquid nozzle 38 move from the retreat position to the process position, by controlling the rinse liquid nozzle transfer device 41. And in a condition that the inner circumferential face of the third guard 53 opposes the circumferential end face of the substrate W, the control device 3 opens the upper rinse liquid valve 40 and the lower rinse liquid valve 46 to cause the rinse liquid nozzle 38 to eject pure water toward the upper face of the substrate W in a rotating condition, while causing the lower-face nozzle 42 to eject pure water toward the center part of the lower face of the substrate W in the rotating condition. Further, the control device 3 makes landing positions of pure water on the upper face of the substrate W be moved between the central part and the peripheral part of the substrate W, by controlling the rinse liquid nozzle transfer device 41. And then upon elapsing of a given time counting from the opening of the upper rinse liquid valve 40 and the lower rinse liquid valve 46, the control device 3 causes the ejection of chemical liquid from the rinse liquid nozzle 38 and the lower-face nozzle 42 to be halted by closing the upper rinse liquid valve 40 and the lower rinse liquid valve 46. Thereafter the control device 3 makes the rinse liquid nozzle 38 be retreated from above the spin chuck 5 by controlling the rinse liquid nozzle transfer device 41.

After landing on the upper face of the substrate W, pure water ejected from the rinse liquid nozzle 38 flows outward along the upper face of the substrate W by centrifugal forces. Likewise, after landing the center part of the lower face of the substrate W, pure water ejected from the lower-face nozzle 42 flows along the lower face of the substrate W by centrifugal forces. Accordingly chemical liquid on the substrate W is pushed outwardly by pure water to be discharged toward the surrounding area of the substrate W. With this, chemical liquid on the substrate W is washed over by pure water, to replace a liquid film of chemical liquid on the substrate W with a liquid film of pure water covering the whole area of the upper face of the substrate W. Likewise, pure water ejected from the lower-face nozzle 42 is supplied over the whole area of the lower face of the substrate W, to wash over chemical liquid adhering on the lower face of the substrate W.

Further, because the control device 3 makes landing positions on the upper face of the substrate W be moved between the central part and the peripheral part of the substrate W in a condition that the substrate W rotates, landing positions of pure water pass through over the whole area of the upper face of the substrate W to scan the whole area of the upper face of the substrate W. Therefore, pure water ejected from the pure water nozzle is directly blown over the whole area of the upper face of the substrate W, to uniformly process the whole area of the upper face of the substrate W. Also, upon reaching the peripheral part of the upper and the lower faces of the substrate W, pure water is thrown off into the surrounding area of the substrate W. Accordingly, pure water discharged from the substrate W is guided into the interior of the cup 7 through the gap between the third guard 53 and the second guard 52, to be collected by the first process liquid cup 48.

Next, drying process for drying the substrate W (STEP S4 in FIG. 6), is performed. Specifically, the control device 3 accelerates the rotation of the substrate W to a high rotation rate (for example, several thousand RPM) by controlling the spin motor 15. With this, liquid on the substrate W is thrown off into the surrounding area of the substrate W, is guided into the interior of the cup 7 through the gap between the second guard 52 and the third guard 53, to be collected by the first process liquid cup 48. In this manner, the substrate W is dried by eliminating moisture therefrom. After the elapse of a given time counting from the commencement of the high-speed rotation, the control device 3 makes the rotation of the substrate W be halted by controlling the spin chuck 5. And then the control device 3 causes all of the guards to be moved to the lower position. In this condition, the control device 3 causes the transfer robot to enter into the interior of the chamber 4 to carry-out the substrate W (a carry-out process, STEP S5 in FIG. 6).

Figure 7:
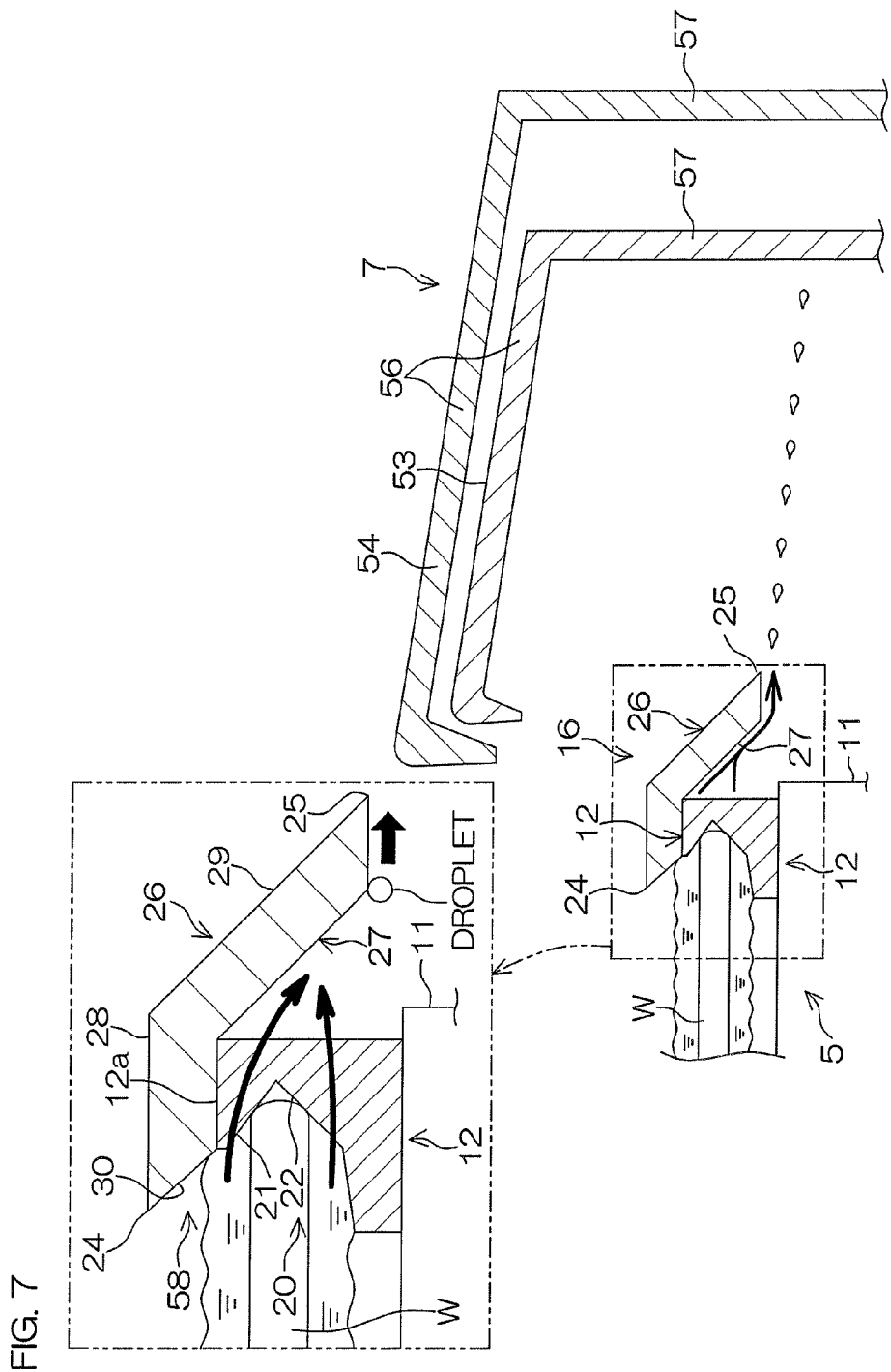
FIG. 7 is a schematic view for illustrating path of process liquid that splashes from the substrate to the surrounding area of the substrate.

FIG. 7 is a schematic view for illustrating path of process liquid that splashes from the substrate to the surrounding area of the substrate.

As is shown in FIG. 7, the inner-edge guides 24 of each of the guide members 16 is disposed inward from the accommodating groove 20 of the chuck pin 12 and above the accommodating 20. The peripheral part of the substrate W is accommodated in the accommodating groove 20. Accordingly, the inner-edge guide 24 is disposed above the upper face of the substrate W and inward from the circumferential end face of the substrate W. Therefore, the collection groove 58 having longitudinal section which faces inwardly (to the side of substrate rotation axis A1) is defined by the substrate W, the chuck pin 12 and the guide member 16. Receiving centrifugal forces, process liquid supplied to the substrate W in a rotating condition extends outwardly. Process liquid reaching the vicinity of the chuck pin 12 enters into the collection 58.

As is shown in FIG. 7, because process liquid reaching the vicinity of the chuck pin 12 enters into the collection groove 58 defined by the substrate W, chuck pin 12 and the guide member 16, even when liquid droplets or mist is generated by collision between process liquid and the chuck pin 12, the spread of liquid droplets or mist is suppressed with the inner face of the collection groove 58. Thereby reattachments of process liquid onto the substrate W are decreased. Further, as process liquid about to flow over the chuck pin 12 is collected into the collection groove 58, it is possible to decrease the amount of process liquid spread obliquely upwardly from the peripheral part of the substrate W. Therefore, it is possible to decrease attachments of droplets or mist of process liquid generated by collision between the cup 7 and process liquid, onto the substrate W.

Also, as is shown in FIG. 7, process liquid entered into the collection groove 58 is guided into the outer-edge guide 25 along the lower guide face 27. As each of the outer-edge guides 25 is disposed below from the inner-edge guide 24, process liquid flowing outward is guided in a horizontal or obliquely downward direction by the guide member 16. Moreover, as the outer-edge guide 25 is disposed outward from the chuck pin 12, process liquid is assuredly guided to a position outward from the chuck pin 12 by the guide member 16. Therefore, it is possible to suppress the spread of process liquid spreading obliquely upward and outward from the chuck pin 12, thereby decreasing reattachments of process liquid which could cause contamination or quality deterioration in quality.

As is described hereinabove, in the preferred embodiment, the direction of spread of process liquid is controlled by the guide member 16, narrowing the area of spread of process liquid to a direction upward from the substrate W. Drifting with down flow, droplets or mist generated by collision between the cup 7 and process liquid move downward while also moving inward. Therefore by narrowing the area of spread of process liquid upward from the substrate W, it is possible to decrease reattachments of process liquid onto the substrate W. Moreover, because it is possible to narrow splash area of process liquid, it is not required to make the cup 7 larger in a radial direction Y1 so as to widen the gap between the substrate W and the cup 7 in the radial direction Y1. In other words, it is possible to decrease depth (inner radius) of the cup 7 than in a conventional apparatus. Thereby it is possible to decrease area of flow path of the circular gas flow path provided between the substrate W and the cup 7. Thus it is possible to lessen the suction power (exhaust pressure) of an exhaust facility while maintaining a rate of gas flow (down flow velocity).

Also in the preferred embodiment, because the outer-edge guide 25 is disposed below from the accommodating groove 20 of the chuck pin 12 accommodating the peripheral part of the substrate W, the substrate W is disposed above from the outer-edge guide 25. In other words, the outer-edge guide 25 is disposed below from the lower face of the substrate W. Accordingly, process liquid is guided to a position below from the substrate W to be splashed towards the cup 7 from the position. Therefore it is possible to decrease the amount of droplets or mist generated above from the substrate W. Thereby it is possible further decrease reattachments of process liquid.

Also in the preferred embodiment, the lower inclined face 32 is configured in the guide member 16, the lower inclined face 32 being inclined so that the upper end of which is more inwardly positioned than the lower end of which. As the lower inclined face 32 is inclined relative to a horizontal plane, process liquid is guided to a direction obliquely downward by the lower inclined face 32. Moreover, because at least part of the lower inclined face 32 is disposed between the chuck pin 12 and the outer-edge guide 25 in a radial direction Y1, process liquid is guided to a position that is outward from the chuck pin 12 and obliquely downward. Therefore it is possible to decrease the amount of process liquid splashing from the peripheral part of the substrate W obliquely upward. Thereby it is possible to further decrease reattachments of process liquid.

Also in the preferred embodiment, the inward face 30 that is inclined relative to a horizontal plane so as to oppose the substrate rotation axis A1 in a radial direction Y1 is configured in the guide member 16. The inward face 30 extends in a direction outward and obliquely downward from the inner-edge guide 24 and is disposed on or above from the accommodating groove 20. Accordingly, process liquid reaching the vicinity of the chuck pin 12 is entered into the collection groove 58 defined by the substrate W, chuck pin 12 and the guide member 16, while being guided to a direction outward and obliquely downward by the inward face 30. Therefore it is possible to decrease the amount of process liquid splashed in directions outward and obliquely upward.

Also in the preferred embodiment, because the chuck pin is distinct from the guide member, it is possible to achieve less intricate shape of the chuck pin 12. Likewise, it is possible to achieve less intricate shape of the guide member 16. Moreover, as the guide member 16 is disposed on the pin top face 12*a*, the guide member 16 can assuredly guide process liquid, that is about to flow over the pin top face 12*a*, in a direction horizontal and obliquely downward. Accordingly, it is possible to further decrease the amount of process liquid splashing in directions outward and obliquely upward, thereby further decreasing reattachments of process liquid.

Also in the preferred embodiment, the guide member 16 is disposed on or above the pin top face 12*a*, and the guide member 16 overlaps the whole area of the pin top face 12*a* in planar view. The area of the guide member 16 in planar view is larger than that of the pin top face 12*a* in a planar view. The guide member 16 covers the whole area of the pin top face 12*a* from thereabove. Accordingly, it is possible to decrease the amount of process liquid splashing in directions outward and obliquely upward more than a case that the guide member 16 partially covers the pin top face 12*a*. Thereby it is possible to further decrease reattachments of process liquid.

Also in the preferred embodiment, height difference of the inner-edge guide 24 from the pin top face 12*a* is greater than that of the pin top face 12*a* from the upper face of the substrate W at the hold position. In other words, vertical distance of the pin top face 12*a* from the upper face of the substrate W is small. Accordingly, shortening of vertical distance from the upper face of the substrate W to the inner-edge guide 24 is achieved, rendering the inner-edge guide 24 more proximate to the upper face of the substrate W. Thus, shortening of the vertical length of the collection groove 58 is achieved, decreasing the volume of the collection groove 58. Thereby the gap (the interior part of the collection groove 58) in a vertical direction between the substrate W and the guide member 16 becomes easier to be filled with process liquid. When the collection groove 58 is filled with process liquid, subsequent process liquid does not directly collide with the inner face of the collection groove 58. Therefore it is possible to decrease the amount of droplets or mist of process liquid generated by collision, thereby decreasing reattachments of process liquid.

Also in the preferred embodiment, distance from the inner-edge guide 24 to an inner edge of the pin top face 12*a* in a radial direction Y1 is greater than height difference of the pin top face 12*a* from an upper face of the substrate W at the hold position. In other words, the amount of inward protrusion of the guide member 24 from the inner edge of the pin top face 12*a* is large, and distance in a radial direction Y1 from the inner-edge guide 24 to the circumferential end of the substrate W is long. Accordingly, depth of the collection groove 58 (horizontal length between the opening part of the collection groove 58 and the bottom of the collection groove 58) is sufficiently secured. Thus, the guide member 16 can assuredly intercept process liquid about to flow over the chuck pin 12, guiding process liquid in a direction horizontal or obliquely downward. Thereby it is possible to decrease reattachments of process liquid.

Although the preferred embodiment of the present invention has been described hereinabove, it should be clear for those skilled in the art that the present invention may not be limited by the content of aforementioned embodiment and that the present invention can be put into practice with various modifications within the scopes of the invention defined in the appended claims. For example, in the aforementioned embodiment, a case wherein an outer-edge guide 25 is disposed below an inner-edge guide 24 is described. But The inner-edge guide 24 and the outer-edge guide 25 may be disposed at a mutually equal height.

Figure 8:
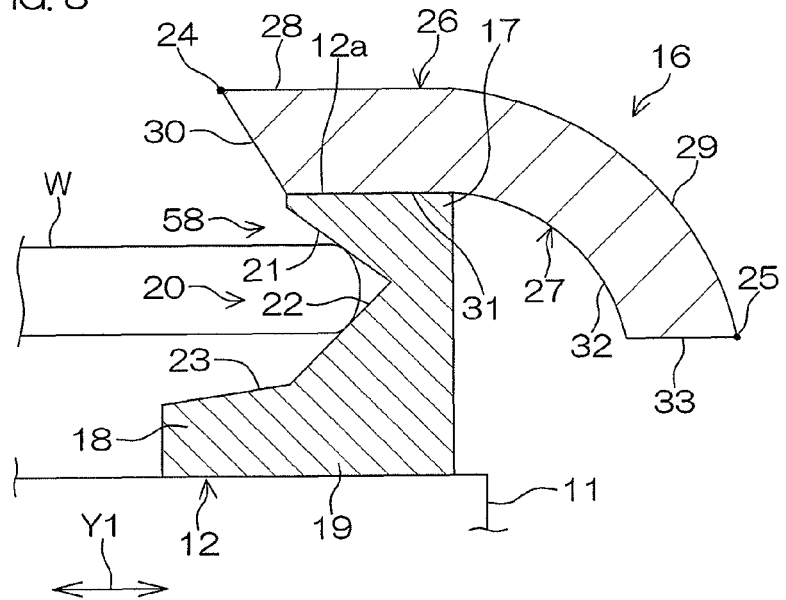
FIG. 8 is a vertical cross-sectional schematic view of a guide member according another preferred embodiment of the present invention.

Also, in the aforementioned embodiment, a case wherein an upper guide face 26 and a lower guide face 27 is a plane inclined relative to a horizontal plane. But as shown in FIG. 8, the upper guide face 26 and the lower guide face 27 may include a curved surface that bulges in a direction outward and obliquely upward. Also, either one of the upper guide face 26 and the lower guide face 27 may include a plane inclined relative to a horizontal plane, and the other one of the upper guide face 26 and the lower guide face 27 may include a curved surface that bulges in a direction outward and obliquely upward.

Figure 9:
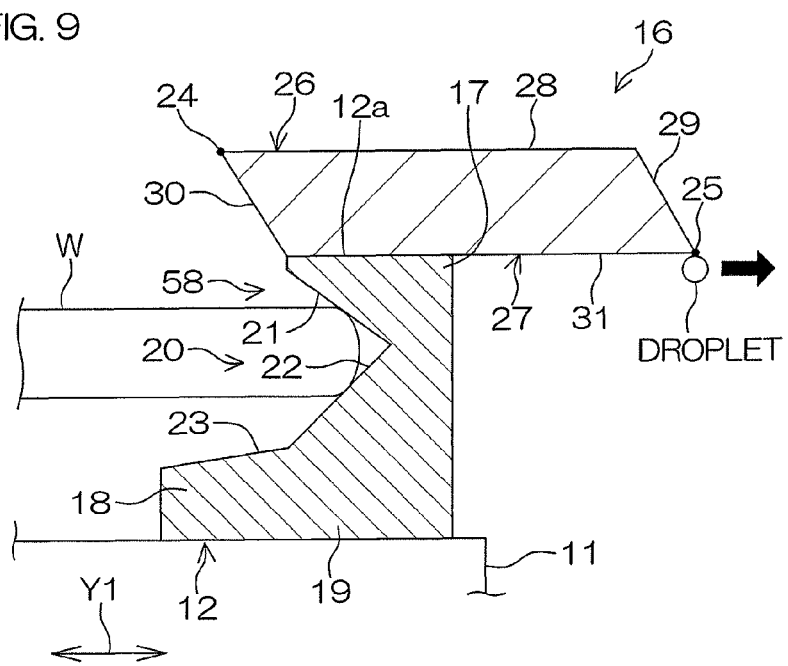
FIG. 9 is a vertical cross-sectional schematic view of a guide member according still another preferred embodiment of the present invention.

Also, in the aforementioned embodiment, a case wherein a guide member 16 is bent is described. But as shown in FIG. 9, the guide member 16 may extend along a horizontal plane. The guide member 16 shown in FIG. 9 includes an outward face 29 that is inclined so that the upper end of the outward face 29 is inwardly positioned than the lower end of the outward face 29. The outward face 29 extends in a direction inward and obliquely upward from an outer-edge guide 25. When the outward face 29 is inclined so that the upper end is positioned more outward from the lower end, process liquid is guided to a direction outward and obliquely upward by the outward face 29. Accordingly the amount of process liquid splashing in directions outward and obliquely upward is increased. Therefore it is possible to further decrease the amount of process liquid splashing in directions outward and obliquely upward by inclining the outward face 29 so that the upper end is more inwardly positioned than the lower end. With this, it is possible to further decrease reattachments of process liquid.

Also, in the aforementioned embodiment, a case wherein the length of a guide member 16 in a circumferential direction X1 is smaller than the gap between two guide members 16 neighboring in the circumferential direction X1 is described. But as shown in FIG. 10, the guide member 16 may have a length in a circumferential direction X1 longer than the gap between two guide members 16 neighboring in the circumferential direction X1.

According to this configuration, because the guide member 16 is long in a circumferential direction X1, the area wherein the directions of splash of process liquid are controlled by the guide member 16 is long in the circumferential direction X1. Accordingly it is possible to further decrease the amount of process liquid splashing in directions outward and obliquely upward by the plurality of guide members 16, thereby decreasing reattachments of process liquid. Moreover, because process liquid on the substrate W is held inward of the plurality of guide members 16, by means of the plurality of guide members 16 each having long length in a circumferential direction, it is possible to decrease the amount of process liquid required to form liquid film covering the whole area of the upper face of the substrate. Thereby it is possible to decrease running cost of the substrate processing apparatus. Also, because the gap between the two guide members 16 neighboring in a circumferential direction X1 is small, turbulence in gas flow is not likely to be generated when the guide members 16 is rotated around a substrate rotation axis A1. Therefore it is possible to decrease reattachments of liquid droplets or mist whiled up by turbulence.

Also, although the aforementioned preferred embodiment described a case wherein a guide member 16 and a chuck pin 12 attached to a guide member 16 are distinct, the guide member 16 and the chuck pin 12 may be integrally formed.

Also, although the aforementioned preferred embodiment described a case wherein a guide member 16 overlaps the whole area of a pin top face 12a in planar view, and the whole area of the pin top face 12a is covered by the guide member 16, the pin top face 12a may be partially covered by the guide member 16 and a part of the pin top face 12a may protrude from the guide member 16 in planar view.

Also, although each of the length of the aforementioned embodiment described a case wherein a inner-edge guide 24 and an outer-edge guide 25 in a circumferential direction X1 is longer than the length of a pin top face 12a in the circumferential direction X1, the length of the inner-edge guide 24 in the circumferential direction X1 may be equal to the length of the pin top face 12a in the circumferential direction X1 or may be shorter than the length of the pin top face 12a in the circumferential direction X1. The length of the outer-edge guide 25 in the circumferential direction X1 goes likewise.

Also, although the aforementioned embodiment described a case wherein a guide member 16 is in the form of plate, the guide member 16 may not be in the form of plate. That is, the upper side face of a guide member 16 and the lower side face of the guide member 16 may not in parallel.

Also, although the aforementioned embodiment described a case wherein both a chemical liquid nozzle 34 and a rinse liquid nozzle 38 are scan nozzles, either one or both of the chemical liquid nozzle 34 and the rinse liquid nozzle 38 may be fixed nozzles ejecting process liquid toward the center of the upper face of a substrate W in a condition that ejection orifice is kept at rest.

Although the preferred embodiment of the present invention has been described in detail, the embodiment is merely a specific example used to clarify the technical contents of the present invention, and the present invention should not be understood as being limited to this specific example; and the scope of the present invention be limited solely by the appended claims.

The present application corresponds to Japanese Patent Application No. 2013-52977 filed in the Japan Patent Office on Mar. 15, 2013, the entire disclosure of which is incorporated herein by reference.

What is claimed is:

1. A substrate processing apparatus for processing a substrate comprising:
   a spin chuck comprising a plurality of chuck pins each having an accommodating groove for accommodating a portion of peripheral part of the substrate, holding the substrate at a hold position in a horizontal posture by pressing inner faces of the accommodating grooves toward portions of peripheral part of the substrate;
   a nozzle for ejecting process liquid toward the substrate held by the plurality of chuck pins;
   a plurality of guide members, being disposed on the spin chuck, on or above the respective plurality of chuck pins, guiding process liquid discharged from the substrate to a surrounding area of the substrate;
   a spin motor for rotating the spin chuck along with the plurality of chuck pins and the plurality of guide members around a substrate rotation axis that vertically passes through the substrate; and
   a tubular cup, encircling the plurality of chuck pins and the guide members around the substrate rotation axis, receiving process liquid discharged outwardly from the substrate held by the plurality of chuck pins;
   wherein each of the plurality of guide member includes:
   an inner-edge guide disposed at a position inward and above the accommodating groove; and
   an outer-edge guide disposed at a position level with or below the inner-edge guide and outward the chuck pin.

2. The substrate processing apparatus according to claim 1, wherein the outer-edge guide is disposed below the accommodating groove.

3. The substrate processing apparatus according to claim 1, wherein the guide member further includes
   a lower inclined face, at least a part of the lower inclined face being disposed between the chuck pin and the outer-edge guide in a radial direction perpendicular to the substrate rotation axis; and
   the lower inclined face being inclined so that upper edge of the lower inclined face is more inwardly positioned than lower edge of the lower inclined face.

4. The substrate processing apparatus according to claim 1, wherein each said guide member further includes an inward face that extends in a direction outward and obliquely downward from the inner-edge guide, and is disposed on or above the accommodating groove.

5. The substrate processing apparatus according to claim 1, wherein each said guide member further includes an outward face that extends in a direction inward and obliquely upward.

6. The substrate processing apparatus according to claim 1, wherein each said chuck pin includes a pin top face, and the corresponding guide member is distinct from the chuck pin and is disposed on the pin top face.

7. The substrate processing apparatus according to claim 6, wherein the guide member overlaps the whole area of the pin top face in planar view.

8. The substrate processing apparatus according to claim 6, wherein a height difference of the inner-edge guide from the pin top face is greater than a height difference of the pin top face from the upper face of the substrate at the hold position.

9. The substrate processing apparatus according to claim 6, wherein a distance from the inner-edge guide to an inner edge of the pin top face in a radial direction that is perpendicular to the substrate rotation axis, is greater than a height difference of the pin top face from an upper face of the substrate at the hold position.

10. The substrate processing apparatus according to claim 1, wherein the plurality of guide members are circularly disposed on the spin chuck along a circumferential direction around the substrate rotation axis, and a length of each guide member in the circumferential direction is greater than a distance between the guide members adjacent in the circumferential direction.

* * * * *